United States Patent
Hsu et al.

(10) Patent No.: US 9,691,665 B2
(45) Date of Patent: Jun. 27, 2017

(54) SEMICONDUCTOR STRUCTURE WITH SELF-ALIGNED SPACERS AND METHOD OF FABRICATING THE SAME

(71) Applicant: UNITED MICROELECTRONICS CORP., Hsin-Chu (TW)

(72) Inventors: Chih-Kai Hsu, Tainan (TW); Yu-Hsiang Hung, Tainan (TW); Ssu-I Fu, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/825,183

(22) Filed: Aug. 13, 2015

(65) Prior Publication Data

US 2017/0018460 A1 Jan. 19, 2017

(30) Foreign Application Priority Data

Jul. 13, 2015 (CN) .......................... 2015 1 0407826

(51) Int. Cl.
*H01L 21/8234* (2006.01)
*H01L 29/78* (2006.01)
*H01L 29/66* (2006.01)
*H01L 21/768* (2006.01)
*H01L 21/02* (2006.01)
(Continued)

(52) U.S. Cl.
CPC .. *H01L 21/823475* (2013.01); *H01L 21/0206* (2013.01); *H01L 21/0217* (2013.01); *H01L 21/0226* (2013.01); *H01L 21/02126* (2013.01); *H01L 21/02164* (2013.01); *H01L 21/02167* (2013.01); *H01L 21/02236* (2013.01); *H01L 21/76897* (2013.01); *H01L 21/823431* (2013.01); *H01L 23/535* (2013.01); *H01L 27/088* (2013.01); *H01L 27/0886* (2013.01); *H01L 29/6656* (2013.01); *H01L 29/66795* (2013.01); *H01L 29/7856* (2013.01)

(58) Field of Classification Search
CPC ........... H01L 27/0207; H01L 27/11807; H01L 27/104; H01L 27/11; H01L 27/092
See application file for complete search history.

(56) References Cited

U.S. PATENT DOCUMENTS 7,135,744 B2  11/2006  Kim
7,375,392 B1 * 5/2008  Chen ................ H01L 21/76897
                                                           257/314

(Continued)

*Primary Examiner* — Quoc Hoang
(74) *Attorney, Agent, or Firm* — Winston Hsu (57) ABSTRACT

A method of fabricating a semiconductor with self-aligned spacer includes providing a substrate. At least two gate structures are disposed on the substrate. The substrate between two gate structures is exposed. A silicon oxide layer is formed to cover the exposed substrate. A nitride-containing material layer covers each gate structure and silicon oxide layer. Later, the nitride-containing material layer is etched to form a first self-aligned spacer on a sidewall of each gate structure and part of the silicon oxide layer is exposed, wherein the sidewalls are opposed to each other. Then, the exposed silicon oxide layer is removed to form a second self-aligned spacer. The first self-aligned spacer and the second self-aligned spacer cooperatively define a recess on the substrate. Finally, a contact plug is formed in the recess.

8 Claims, 6 Drawing Sheets

(51) Int. Cl.
*H01L 23/535* (2006.01)
*H01L 27/088* (2006.01)

(56) References Cited

U.S. PATENT DOCUMENTS 8,236,702 B2  8/2012  Chang
8,981,422 B2 * 3/2015  Takeuchi .......... H01L 21/76834
                                                    257/128

* cited by examiner

SEMICONDUCTOR STRUCTURE WITH SELF-ALIGNED SPACERS AND METHOD OF FABRICATING THE SAME

BACKGROUND OF THE INVENTION

1. Field of the Invention

The present invention relates to a method of fabricating a semiconductor structure with self-aligned spacers, and more particularly, to a method of fabricating a semiconductor structure with double layers of self-aligned spacers.

2. Description of the Prior Art

As is the case for most semiconductor integrated circuitry, circuit density is continuing to increase at a fairly constant rate. In semiconductor devices, it may be advantageous to build contact plugs for interlayer connections having high aspect ratio structures, as circuit density will be enhanced.

Unfortunately, current technology is not capable of making these contact openings at such high density. To overcome this problem, prior art approaches create a self-aligned contact. The key techniques in making the self-aligned contact include the use of spacers formed on the gates. With this method, however, the substrate is often damaged during the fabricating process, and the performance of the semiconductive device is therefore compromised. In light of this, there is a need to improve the method of forming a self-aligned contact.

SUMMARY OF THE INVENTION

Accordingly, the present invention provides a method of fabricating a self-aligned contact by using composite self-aligned spacers.

According to a preferred embodiment of the present invention, a method of fabricating a semiconductor structure with self-aligned spacers includes providing a substrate with at least two gate structures disposed on the substrate, wherein the substrate between the gate structures is exposed. Then, a silicon oxide layer is formed to cover the exposed substrate. A nitride-containing material layer is formed to cover the gate structures and the silicon oxide layer. After that, the nitride-containing material layer is etched to form a first self-aligned spacer at a sidewall of each gate structure, exposing part of the silicon oxide layer, wherein the sidewalls of each gate structure are opposed to each other. Subsequently, the exposed silicon oxide layer is removed to form a second self-aligned spacer, wherein the first self-aligned spacer and the second self-aligned spacer cooperatively define a recess on the substrate. Finally, a contact plug is formed in the recess.

According to a preferred embodiment of the present invention, a semiconductor structure with self-aligned spacers includes a substrate, two gate structures disposed on the substrate, and composite self-aligned spacers respectively disposed on a sidewall of each of the gate structures, wherein the sidewalls of each of the gate structures are opposed to each other, each of the composite self-aligned spacers comprises a nitride-containing material layer and a silicon oxide layer, and the silicon oxide layer is disposed between the substrate and the nitride-containing material layer. The semiconductor structure with self-aligned spacers further includes a contact plug disposed between the composite self-aligned spacers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
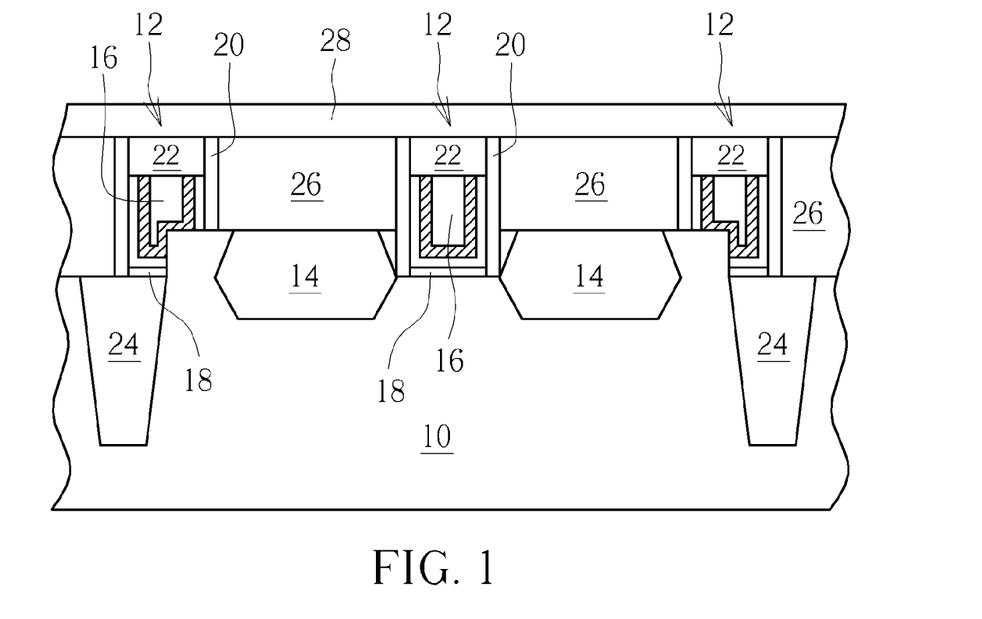
FIG. 1 to FIG. 6 depict a method of fabricating a FinFET with self-aligned spacers according to a first preferred embodiment of the present invention.
Figure 10:
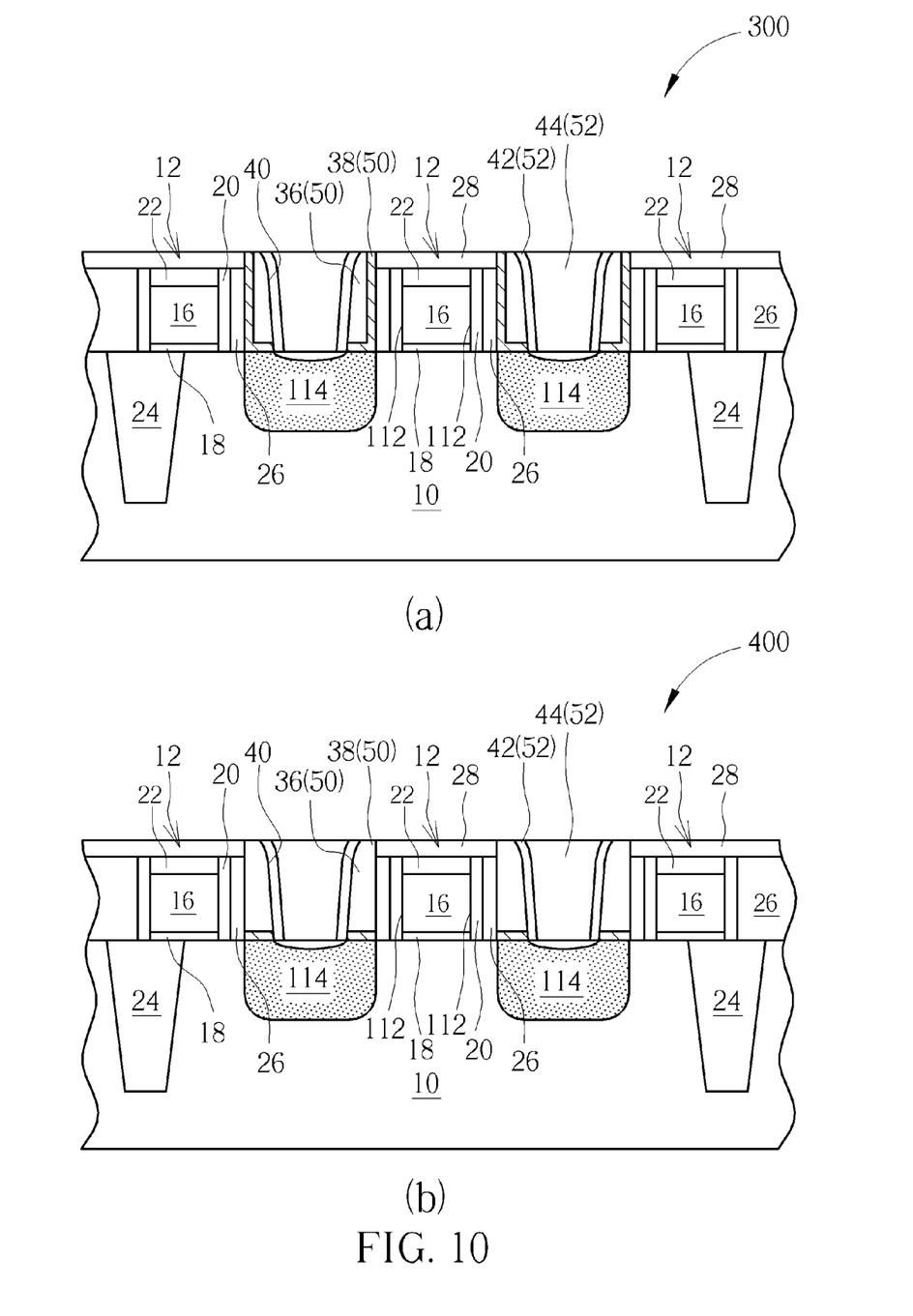
FIG. 10 depicts a planar transistor with self-aligned spacers, wherein the example (a) in FIG. 10 depicts a planar transistor with self-aligned spacers according to a fifth embodiment of the present invention, and the example (b) in FIG. 10 depicts a planar transistor with self-aligned spacers according to a sixth embodiment of the present invention.

FIG. 1 to FIG. 6 depict a method of fabricating a FinFET with self-aligned spacers according to a first preferred embodiment of the present invention. As shown in FIG. 1, a substrate 10 is provided. At least two gate structures 12 are disposed on the substrate 10. An epitaxial layer 14 or a doping region (not shown) is disposed in the substrate 10 between the gate structures 12. FIG. 1 shows the epitaxial layer 14 as an example. The substrate 10 in FIG. 1 includes a fin structure but is not limited thereto. The substrate 10 can be a planar substrate as shown in FIG. 10. In the first preferred embodiment, the substrate 10 is preferably a silicon substrate. In addition, the substrate 10 may be any suitable substrate, a III-V compound substrate, a silicon germanium (SiGe) substrate, an epi-substrate, or the like. The substrate 10 may optionally have other layers formed therein or thereon, such as dielectric or metals that may form other devices, conductive traces, or the like.

The gate structure 12 can include a gate electrode 16 and a gate dielectric layer 18 disposed under the gate electrode 16. A spacer 20 is disposed at two sides of the gate structure 12. A cap layer 22 may cover the gate electrode 16. A shallow trench isolation (STI) 24 is embedded in the substrate 10 and sandwiches the fin structure. A dielectric layer 26 covers the substrate 10, the epitaxial layer 14 and the STI 24. A dielectric layer 28 covers the dielectric layer 26 and the gate structures 12.

The epitaxial layer 14 is a single semiconductive layer or multiple semiconductive layers formed by a selective epitaxial growth process. The epitaxial layer 14 may be silicon, germanium, or silicon germanium. According to a preferred embodiment, the epitaxial layer 14 is double layered. The lower layer of the epitaxial layer 14 is silicon germanium and the upper layer of the epitaxial layer 14 is silicon. The gate electrode 16 may include one or multiple layers of insulating layers such as silicon oxide or high-k materials. The spacer 20, the cap layer 22, the STI 24, and the dielectric layers 26/28 may include one or multiple layers of insulating layers such as silicon oxide, silicon nitride, silicon carbonitride or silicon oxycarbonitride. In one embodiment, the spacer 20 and the cap layer 22 are silicon nitride. The STI 24, the dielectric layers 26/28 are silicon oxide.

Figure 2:
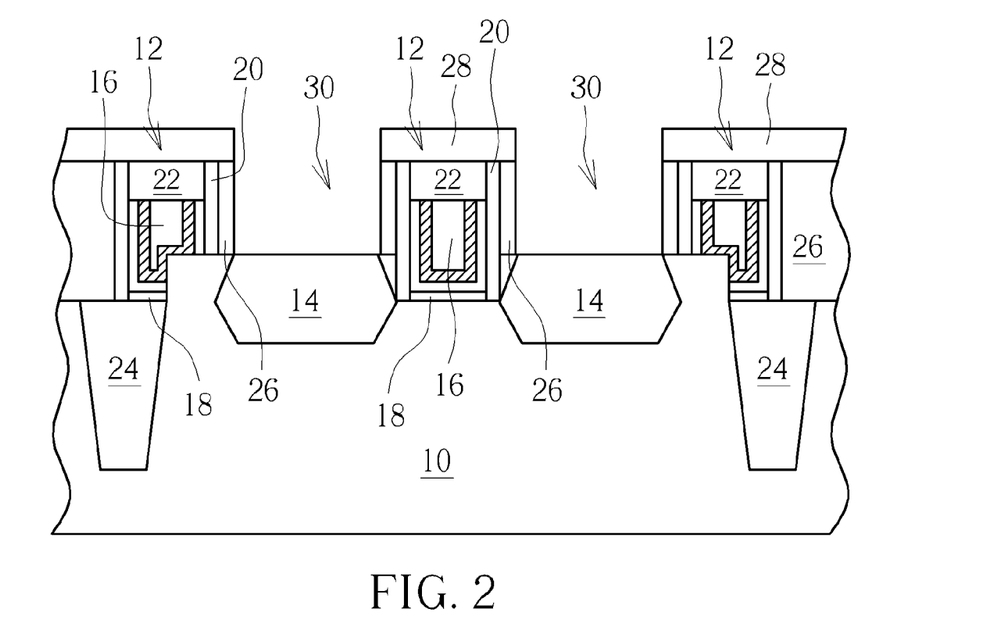

As shown in FIG. 2, the dielectric layer 26 and the dielectric layer 28 are patterned to expose the substrate 10 which includes the epitaxial layer 14 which is between the adjacent gate structures 12. This involves forming a contact hole 30 between the adjacent gate structures 12. The steps of patterning the dielectric layer 26 and the dielectric layer 28 include removing part of the dielectric layer 26 and part of the dielectric layer 28 by a lithographic process to form the contact hole 30. Based on different conditions, some dielectric layers 26/28 can remain on the spacer 20 to prevent damage to the gate structure 12 and the spacer 20 due to the offset of the lithographic process. In this embodiment, the contact hole 30 is defined by the dielectric layers 26/28 remaining on the spacer 20 and a top surface of the epitaxial layer 14.

Figure 3:
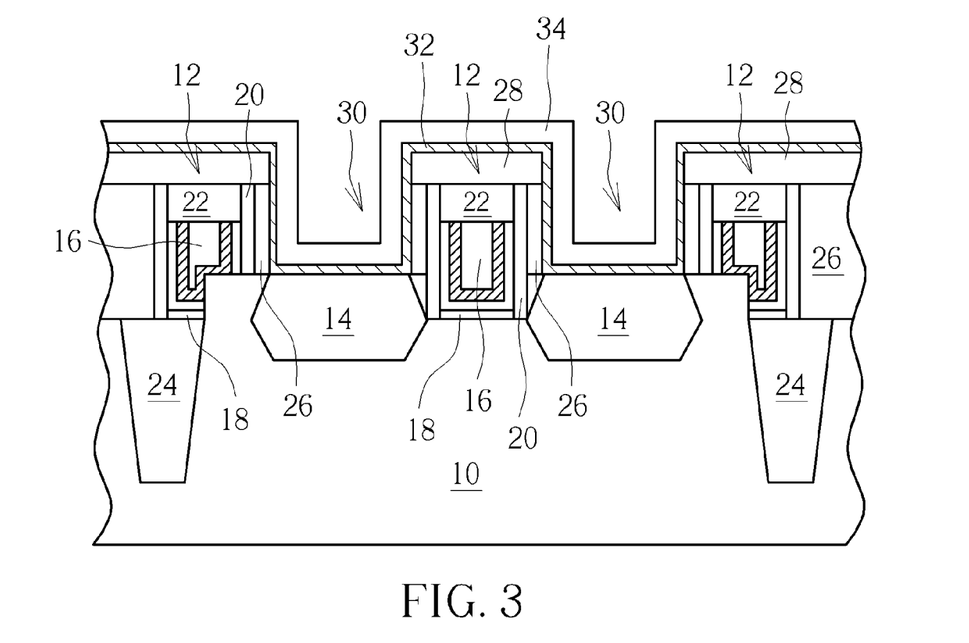

As shown in FIG. 3, a silicon oxide layer 32 is formed to conformally cover the dielectric layers 26/28 and the substrate 10 comprising the epitaxial layer 14. The thickness of the silicon oxide layer 32 is greater than 10 angstroms, and preferably greater than 20 angstroms. In detail, the silicon oxide layer 32 is formed by a deposition process to conformally fill in the contact hole 30 and contact the substrate 14. Then, a nitride-containing material layer conformally covers the silicon oxide layer 32. The nitride-containing material layer 34 covers the silicon oxide layer 32 and the gate structures 12, the dielectric layers 26/28 and the epitaxial layer 14 under the silicon oxide layer 32. The nitride-containing material layer 34 includes silicon nitride, silicon oxynitride, silicon carbonitride or silicon oxycarbonitride, but is not limited thereto. Other nitride-containing materials may also be used as the nitride-containing material layer 34. Furthermore, the nitride-containing material layer 34 can include stress and the stress in the nitride-containing material layer 34 can be transferred into the epitaxial layer 14 by a thermal process. It is noteworthy that the contact hole 30 is formed before the silicon oxide layer 32 and the nitride-containing material layer 34 are formed.

Figure 4:
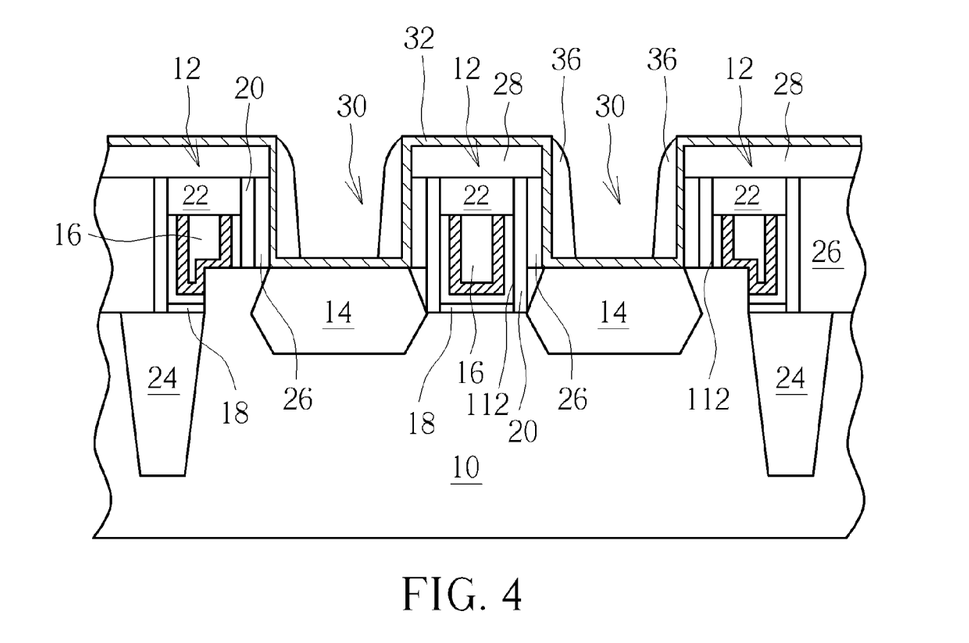

As shown in FIG. 4, the nitride-containing material layer 34 is etched to form a first self-aligned spacer 36 at a sidewall 112 of each of the gate structures 12 and expose the silicon oxide layer 32 which contacts the epitaxial layer 14. The first self-aligned spacer 36 is made of the nitride-containing material layer 34. The sidewalls 114 of each of the gate structures 12 are opposed to each other. The nitride-containing material layer 34 is preferably etched anisotropically by taking the silicon oxide layer 32 as an etching stop layer. For example, the nitride-containing material layer 34 can be dry etched. In this way, the epitaxial layer 14 is protected by the silicon oxide layer 32 from being damaged by etchant during the formation of the first self-aligned spacer 36. In addition, some dielectric layers 26/28 optionally remain on the spacer 20; therefore, when etching the nitride-containing material layer 34, the dielectric layers 26/28, the spacer 20 and the cap layer 22 work together to protect the gate electrode 16 from being damaged by over etched or etching shift.

Figure 5:
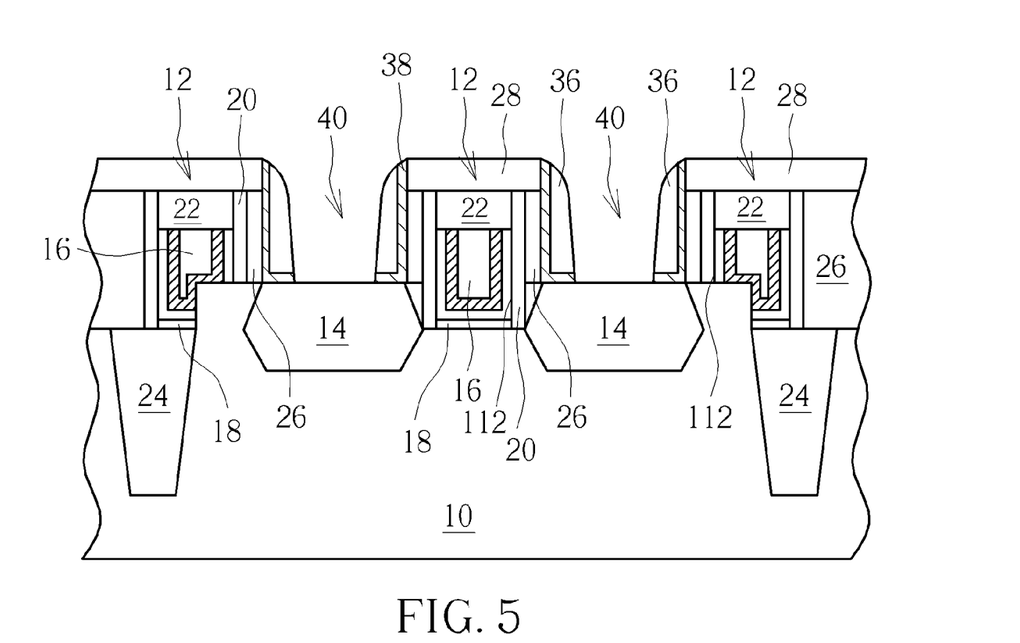

As shown in FIG. 5, the exposed silicon oxide layer 32 is removed and the remaining silicon oxide layer 32 forms a second self-aligned spacer 38. The second self-aligned spacer 38 is made of the silicon oxide layer 32. The first self-aligned spacer 36 and the second self-aligned spacer 38 define a recess 40 within the contact hole 30 and on the substrate 10. The entire second self-aligned spacer 38 has an L-shaped cross section. In addition, the second self-aligned spacer 38 is disposed between the substrate 10 having the epitaxial layer 14 and the first self-aligned spacer 36, and is disposed between the gate structure 12 and the first self-aligned spacer 36. Furthermore, the dielectric layer 28 covers and overlaps the cap layer 22. Both the first self-aligned spacer 36 and the second self-aligned spacer 38 contact the dielectric layer 28. The method of removing the exposed silicon oxide layer 32 includes a pre-clean process.

The pre-clean process may be a SiCoNi™ process. The pre-clean process can be performed in a chamber available from Applied Materials, Inc. of Santa Clara, Calif., or other suitable chambers. The pre-clean process is performed between two different processes for cleaning native oxide, and is a standard process in the conventional fabricating method. The present invention using the pre-clean process to remove the silicon oxide layer 32, therefore no extra step is added to remove the silicon oxide layer 32. The pre-clean process uses remote plasma assisted dry etch process which involves the simultaneous exposure of the exposed silicon oxide layer 32 to nitrogen trifluoride and ammonia. In addition, based on different conditions, hydrogen or hydrogen fluoride can be added into the plasma.

Figure 6:
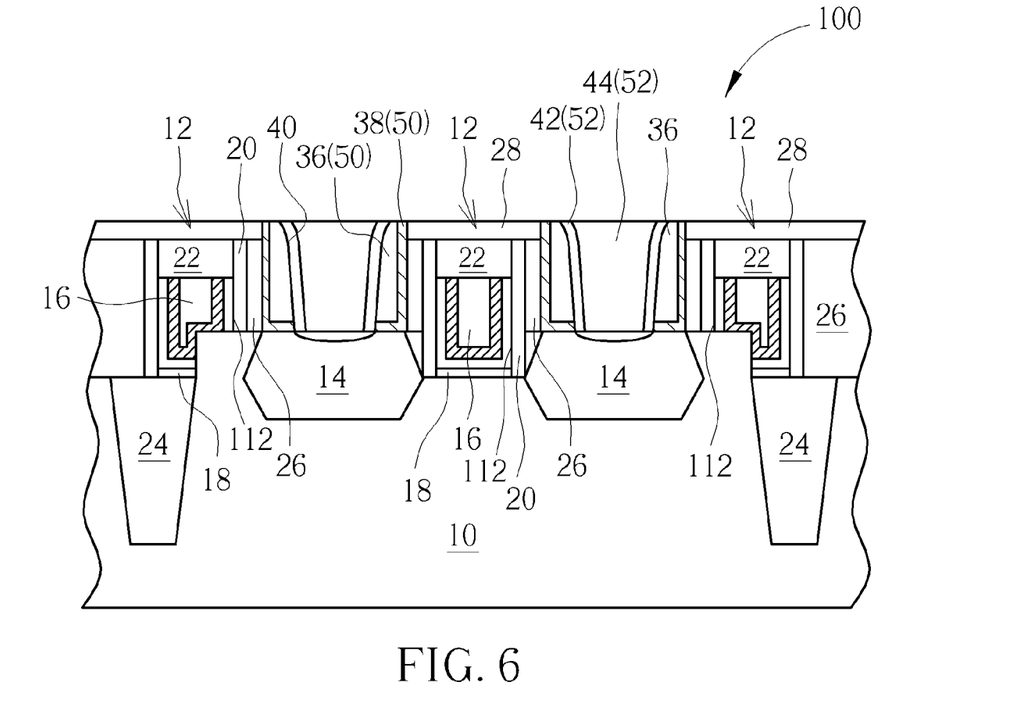

As shown in FIG. 6, a barrier layer 42 such as tantalum nitride or titanium nitride is formed conformally to cover the recess 40. Then, a metal layer 44 is formed to fill in the recess 42. Later, the barrier layer 42 and the metal layer 44 are planarized and the remaining barrier layer 42 and the metal layer 44 in the recess 42 form a contact plug 52. The contact plug 52 electrically connects to the epitaxial layer 14. Before the contact plug 52 is formed, a silicide can be optionally formed on the top surface epitaxial layer 14. At this point, a FinFET (Fin Field-Effect Transistor) with self-aligned spacers 100 according to a first preferred embodiment of the present invention is completed.

FIG. 1 and FIG. 7 to FIG. 9 depict a method of fabricating a FinFET with self-aligned spacers according to a second preferred embodiment of the present invention, wherein like reference numerals are used to refer to like elements throughout. The differences between the first preferred embodiment and the second preferred embodiment are that, in the second preferred embodiment, the silicon oxide layer 32 is formed by oxidizing the surface of a silicon substrate. In the first preferred embodiment, however, the silicon oxide layer 32 is formed by a deposition process. Other steps and elements are the same as in the first preferred embodiment. Please refer to the first preferred embodiment for the detailed process. The method of fabricating a FinFET with self-aligned spacers according to a second preferred embodiment is illustrated as follows. As shown in FIG. 1, a substrate 10 is provided. At least two gate structures 12 are disposed on the substrate 10. An epitaxial layer 14 or a doping region (not shown) is disposed in the substrate 10 between the gate structures 12. The doping region may be a source/drain doping region. The substrate 10 includes a fin structure but is not limited thereto. The substrate 10 can be a planar substrate. The gate structure 12 can include agate electrode 16 and a gate dielectric layer 18 disposed under the gate electrode 16. A spacer 20 is disposed at two sides of the gate structure 12. A cap layer 22 may cover the gate electrode 16. An STI 24 is embedded in the substrate 10 and sandwiches the fin structure. A dielectric layer 26 covers the substrate 10, the epitaxial layer 14 and the STI 24. A dielectric layer 28 covers the dielectric layer 26 and the gate structures 12.

Figure 7:
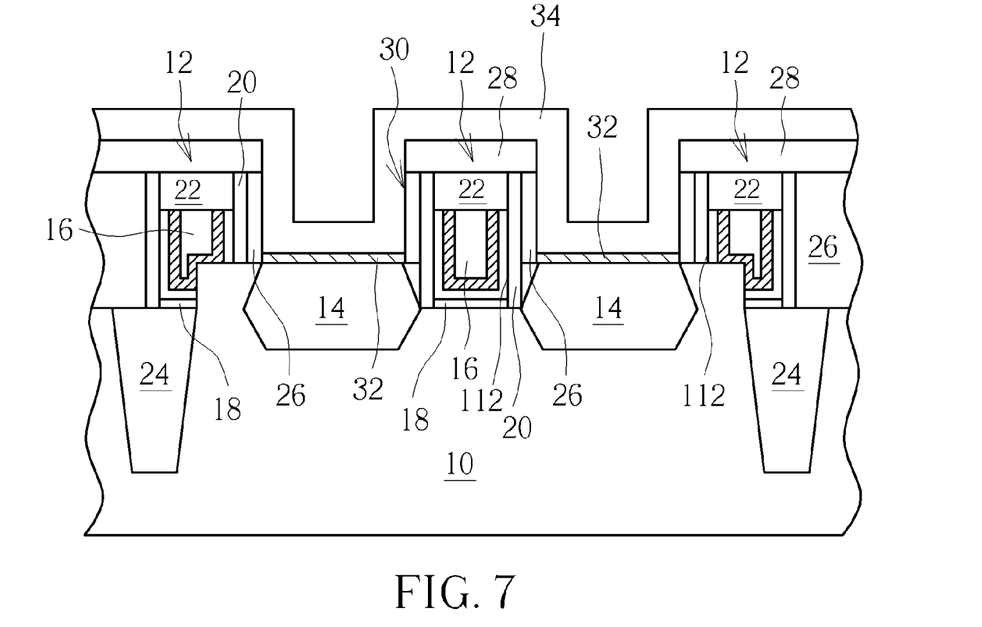
FIG. 7 to FIG. 9 depict a method of fabricating a FinFET with self-aligned spacers according to a second preferred embodiment of the present invention.

As shown in FIG. 7, the dielectric layer 26 and the dielectric layer 28 are patterned to expose the substrate 10 which includes the epitaxial layer 14 which is between the adjacent gate structures 12. This involves forming a contact hole 30 between the adjacent gate structures 12. Later a top surface of the epitaxial layer 14 is oxidized to form a silicon oxide layer 32. If there is no epitaxial layer 14 in the substrate, a top surface of the substrate 14 is oxidized to form the silicon oxide layer 32. The oxidization is preferably performed at a temperature below 600° C. The thickness of the silicon oxide layer 32 is greater than 10 angstroms, and preferably greater than 20 angstroms. Then, a nitride-containing material layer 34 conformally covers the silicon oxide layer 32. The nitride-containing material layer 34 covers the silicon oxide layer 32 and the gate structures 12, the dielectric layers 26/28 and the epitaxial layer 14 under the silicon oxide layer 32. The nitride-containing material layer 34 includes silicon nitride, silicon oxynitride, silicon carbonitride or silicon oxycarbonitride, but is not limited thereto. Other nitride-containing materials may also be used as the nitride-containing material layer 34.

Figure 8:
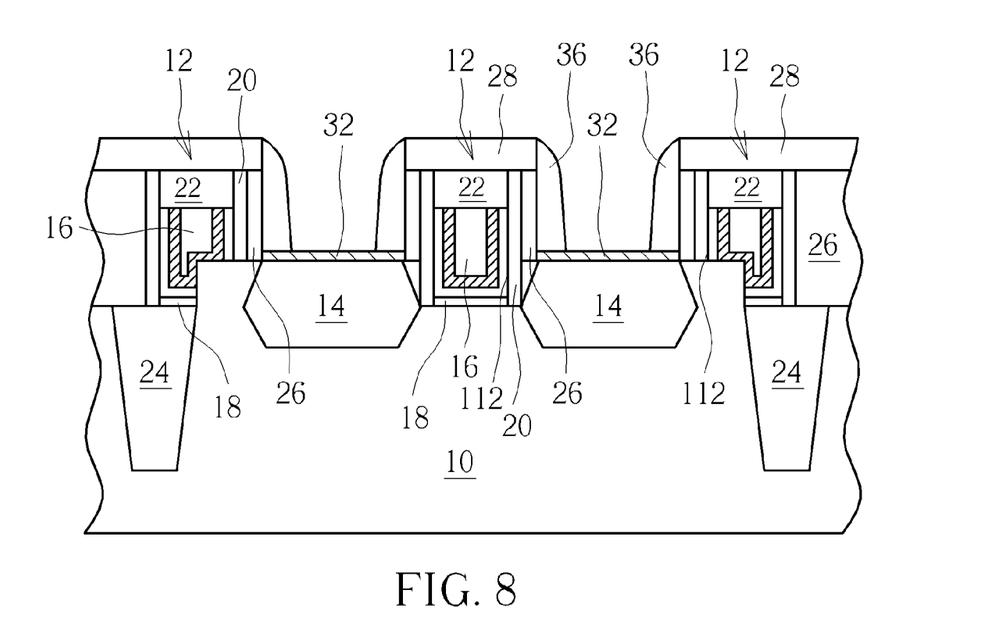

As shown in FIG. 8, the nitride-containing material layer 34 is etched to form a first self-aligned spacer 36 at a sidewall 112 of each of the gate structures 12 by taking the silicon oxide layer 34 as an etching stop layer. After the nitride-containing material layer 34 is etched, part of the silicon oxide layer 32 is exposed.

Figure 9:
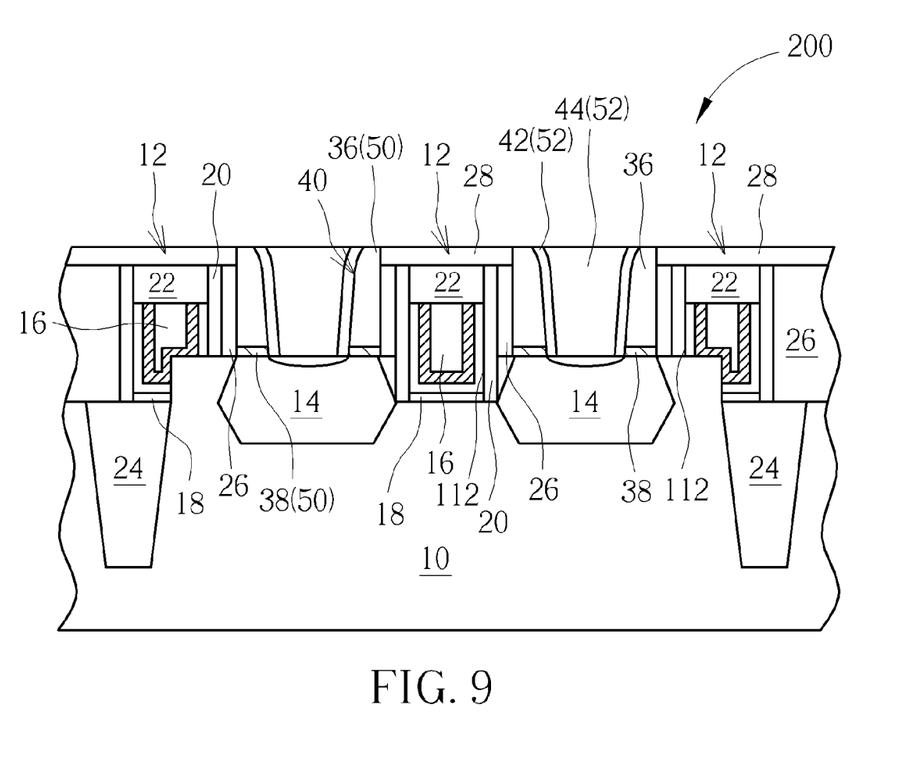

As shown in FIG. 9, the exposed silicon oxide layer 32 is removed to expose the epitaxial layer 14 in the substrate 10. The remaining silicon oxide layer 32 forms a second self-aligned spacer 38. The first self-aligned spacer 36 and the second self-aligned spacer 38 define a recess 40 within the contact hole 30 and on the substrate 10. The entire second self-aligned spacer 38 has a trapezoid-shaped cross section. In addition, the second self-aligned spacer 38 is disposed between the substrate 10 having the epitaxial layer 14 and the first self-aligned spacer 36. There is no second self-aligned spacer 38 between the first self-aligned spacer 36 and the gate structure 12. The method of removing the exposed silicon oxide layer 32 includes a pre-clean process. The pre-clean process uses remote plasma assisted dry etch process which involves the simultaneous exposure of the exposed silicon oxide layer 32 to nitrogen trifluoride and ammonia. Based on different conditions, hydrogen or hydrogen fluoride can be added into the plasma. Later, a barrier layer 42 such as tantalum nitride or titanium nitride is formed conformally to cover the recess 40. Then, a metal layer 44 is formed to fill in the recess 42. Later, the barrier layer 42 and the metal layer 44 are planarized and the remaining barrier layer 42 and the metal layer 44 in the recess 42 form a contact plug 52. Before the contact plug 52 is formed, a silicide can be optionally formed on the top surface epitaxial layer 14. At this point, a FinFET with self-aligned spacers 200 according to a second preferred embodiment of the present invention is completed.

The first preferred embodiment and the second preferred embodiment of the present invention not only can be applied to the FinFET previously described but also can be applied to a planar transistor. The example (a) and the example (b) in FIG. 10 respectively depict a planar transistor with self-aligned spacers 300 and a planar transistor with self-aligned spacers 400 by using the method illustrated in the first preferred embodiment and the second preferred embodiment.

FIG. 6 depicts a FinFET with self-aligned spacers according to a third preferred embodiment of the present invention. As shown in FIG. 6, a FinFET with self-aligned spacers 100 includes a substrate 10. The substrate 10 includes a fin structure but is not limited thereto. The substrate 10 can be a planar substrate. At least two gate structures 12 are disposed on the substrate 10. The gate structure 12 can include a gate electrode 16 and a gate dielectric layer 18 disposed under the gate electrode 16. A spacer 20 is disposed at two sides of the gate structure 12. A cap layer 22 may cover the gate electrode 16. An STI 24 is embedded in the substrate 10 and sandwiches the fin structure. An epitaxial layer 14 or a doping region (not shown) is disposed in the substrate 10 between the gate structures 12. FIG. 6 shows the epitaxial layer 14 as an example.

Composite self-aligned spacers 50 are respectively disposed on a sidewall 112 of each of the gate structures 12. The sidewalls 112 of each of the gate structures 12 are opposed to each other. Each of the composite self-aligned spacers 50 includes a first self-aligned spacer 36 and the second self-aligned spacer 38. The first self-aligned spacer 36 is made of a nitride-containing material layer. The second self-aligned spacer 38 is made of a silicon oxide layer. The thickness of the silicon oxide layer 38 is greater than 10 angstroms, and preferably greater than 20 angstroms. The nitride-containing material layer includes silicon nitride, silicon oxynitride, silicon carbonitride or silicon oxycarbonitride, but is not limited thereto. Other nitride-containing materials may also be used as the second self-aligned spacer 38. The second self-aligned spacer 38 is disposed between the substrate 10 having the epitaxial layer 14 and the first self-aligned spacer 36, and is disposed between the gate structure 12 and the first self-aligned spacer 36. The entire second self-aligned spacer 38 has an L-shaped cross section. Dielectric layers 26/28 can optionally be disposed between one of the composite self-aligned spacer 50 and the spacer 20. Furthermore, a contact plug 52 is disposed between the composite self-aligned spacers 50 and the contact plug 52 contacts the epitaxial layer 14.

FIG. 9 depicts a FinFET with self-aligned spacers according to a fourth preferred embodiment of the present invention. The differences between the fourth preferred embodiment and the third preferred embodiment are that, in the fourth preferred embodiment, the entire second self-aligned spacer 38 has a trapezoid-shaped cross section. Furthermore, the second self-aligned spacer 38 is only disposed between the substrate 10 having the epitaxial layer 14 and the first self-aligned spacer 36. There is no second self-aligned spacer 38 between the first self-aligned spacer 36 and the gate structure 12. Moreover, the substrate 10 in the fourth preferred embodiment must be a silicon substrate. Other elements in FIG. 9 are basically the same as those in FIG. 6; an accompanying explanation is therefore omitted.

The example (a) in FIG. 10 depicts a planar transistor with self-aligned spacers according to a fifth embodiment of the present invention. The differences between the third embodiment and the fifth embodiment are that the transistor in the fifth embodiment is a planar transistor rather than a FinFET, i.e. the substrate 10 is a planar substrate. Furthermore, there is no epitaxial layer disposed in the substrate 10 between the gate structures 12. Other elements in the fifth embodiment are basically the same as those in the third embodiment; an accompanying explanation is therefore omitted.

The example (b) in FIG. 10 depicts a planar transistor with self-aligned spacers according to a sixth embodiment of the present invention. The differences between the sixth embodiment and the fifth embodiment are that the entire second self-aligned spacer 38 has a trapezoid-shaped cross section. The second self-aligned spacer 38 is disposed between the substrate 10 having the epitaxial layer 14 and the first self-aligned spacer 36. There is no second self-aligned spacer 38 between the first self-aligned spacer 36 and the gate structure 12. Other elements in the sixth embodiment are basically the same as those in the fifth embodiment; an accompanying explanation is therefore omitted.

In the first and the second preferred embodiments, the silicon oxide layer 32 is utilized as an etching stop layer during etching of the nitride-containing material layer 34. Then, the silicon oxide layer 32 is removed by a pre-clean process. It is noteworthy that the pre-clean process is a conventional process used between two different fabricating steps to clean native oxide. Therefore, the silicon oxide layer 32 can be removed without adding any new processes. Moreover, the pre-clean process has a high etching ratio between the silicon substrate and the silicon oxide. Generally, the etching ratio of the silicon oxide to silicon substrate is greater than 20:1 in the pre-clean process. Therefore, when removing the silicon oxide layer 32, the substrate or the epitaxial layer 14 under the silicon oxide layer 32 will not be damaged. The conventional process utilizes a silicon nitride as an etching stop layer. The silicon nitride should be removed by hot phosphoric acid; however, the etching ratio of the silicon substrate to the silicon nitride is not high enough by taking the hot phosphoric acid as the etchant. Therefore, the surface of the silicon substrate or the epitaxial layer will be damaged when removing the silicon nitride. The present invention using the silicon oxide as the etching stop layer can prevent damage to the silicon substrate or the epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with self-aligned spacers, comprising:
   a substrate;
   a first gate structure and a second gate structure disposed on the substrate;
   a cap layer disposed on the first gate structure;
   a spacer contacting the cap layer and the first gate structure;
   a dielectric layer disposed on and contacting the cap layer and the spacer;
   composite self-aligned spacers respectively disposed on a sidewall of the first gate structure and a sidewall of the second gate structure, wherein the composite self-aligned spacer on the first gate structure contacts the dielectric layer, the sidewall of the first gate structure and the sidewall of the second gate structure are opposed to each other, each of the composite self-aligned spacers comprises a nitride-containing material layer and a silicon oxide layer, and the silicon oxide layer is disposed between the substrate and the nitride-containing material layer; and
   a contact plug disposed between the composite self-aligned spacers and the contact plug contacting the composite self-aligned spacers.

2. The semiconductor structure with self-aligned spacers of claim 1, wherein the entire silicon oxide layer has a trapezoid-shaped cross section.

3. The semiconductor structure with self-aligned spacers of claim 1, wherein the entire silicon oxide layer has an L-shaped cross section.

4. The semiconductor structure with self-aligned spacers of claim 3, wherein the silicon oxide layer is disposed between the substrate and the nitride-containing material layer, and is disposed between each gate structure and the nitride-containing material layer.

5. The semiconductor structure with self-aligned spacers of claim 1, wherein the nitride-containing material layer comprises silicon nitride, silicon carbonitride or silicon oxycarbonitride.

6. The semiconductor structure with self-aligned spacers of claim 1, wherein the substrate comprises a fin structure or a planar silicon substrate.

7. The semiconductor structure with self-aligned spacers of claim 1, wherein the substrate between the first gate structure and the second gate structure comprises an epitaxial layer or a doping region.

8. The semiconductor structure with self-aligned spacers of claim 1, wherein a first width of the dielectric layer is larger than a second width of the cap layer, and the first width, the second width and a top surface of the substrate are parallel.

* * * * *